United States Patent [19]
Gardner et al.

[11] Patent Number: 6,046,089
[45] Date of Patent: Apr. 4, 2000

[54] SELECTIVELY SIZED SPACERS

[75] Inventors: Mark I. Gardner, Cedar Creek; Fred N. Hause; Charles E. May, both of Austin, all of Tex.

[73] Assignee: Advanced Micro Devices, Sunnyvale, Calif.

[21] Appl. No.: 09/002,727

[22] Filed: Jan. 5, 1998

[51] Int. Cl.[7] ........................ H01L 21/336; H01L 21/311
[52] U.S. Cl. .............................................. 438/303; 438/696
[58] Field of Search .................................... 438/230, 303, 438/366, 445, 595, 696, 593, 279, 275, 265, 330; 257/900, 344, 345

[56] References Cited

U.S. PATENT DOCUMENTS

| | | | |
|---|---|---|---|
| 5,017,515 | 5/1991 | Gill | 438/128 |
| 5,177,570 | 1/1993 | Tanaka | 257/345 |
| 5,371,026 | 12/1994 | Hayden et al. | 438/275 |
| 5,424,571 | 6/1995 | Liou | 257/344 |
| 5,783,475 | 7/1998 | Ramaswami | 438/303 |
| 5,874,330 | 2/1999 | Ahn | 438/230 |

*Primary Examiner*—Wael Fahmy
*Assistant Examiner*—William David Coleman

[57] ABSTRACT

The formation of selectively sized spacers is disclosed. One embodiment comprises a method including four steps. In the first step, at least one spacer for each of a plurality of gates is formed on a substrate, the plurality of gates including a first gate and at least one remaining gate, and each spacer adjacent to an edge of its corresponding gate. In the second step, a mask is applied to the first gate, including the spacers for the first gate. In the third step, the spacers for the remaining gates are etched. In the fourth step, the mask applied to the first gate, including the spacers for the first gate, is removed.

18 Claims, 5 Drawing Sheets

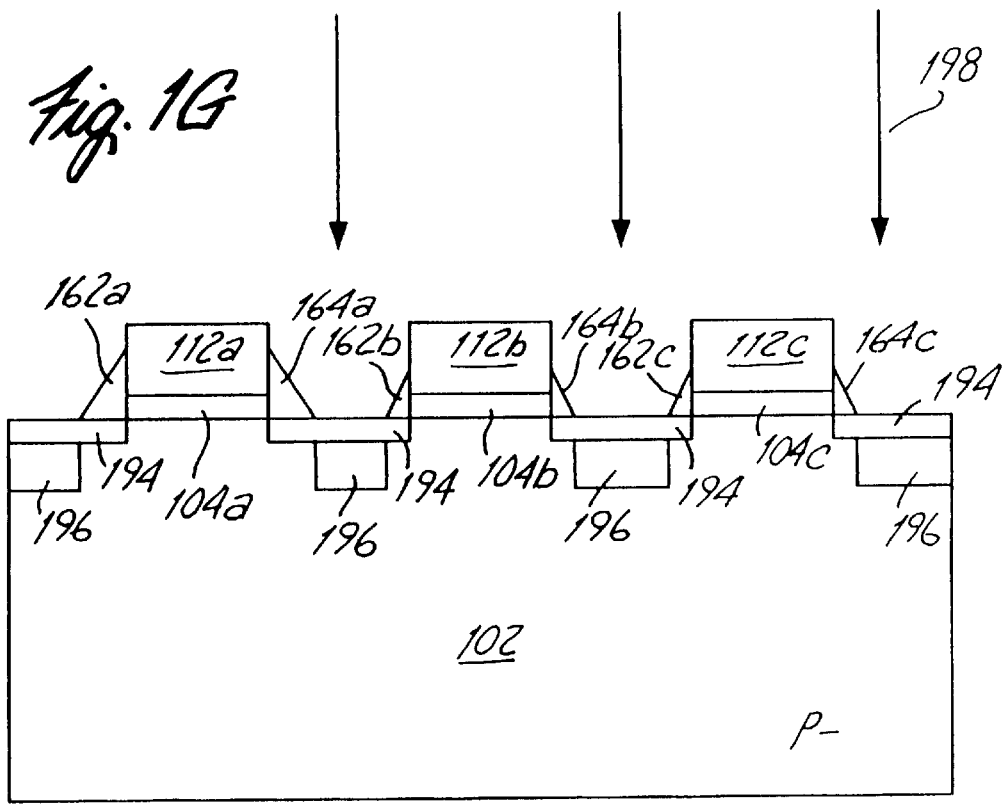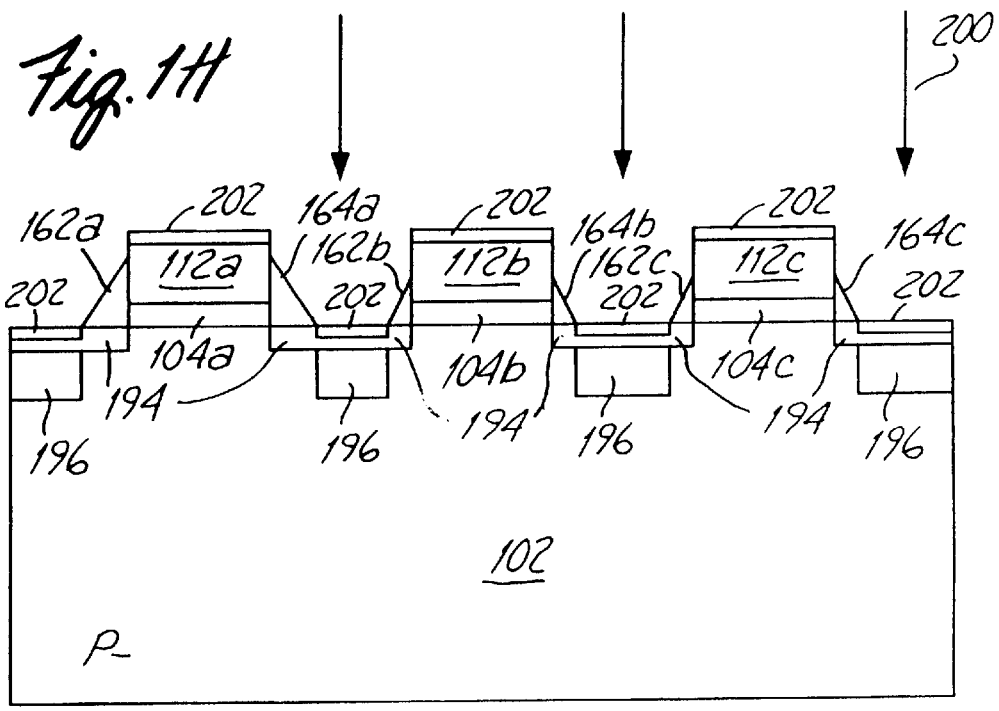

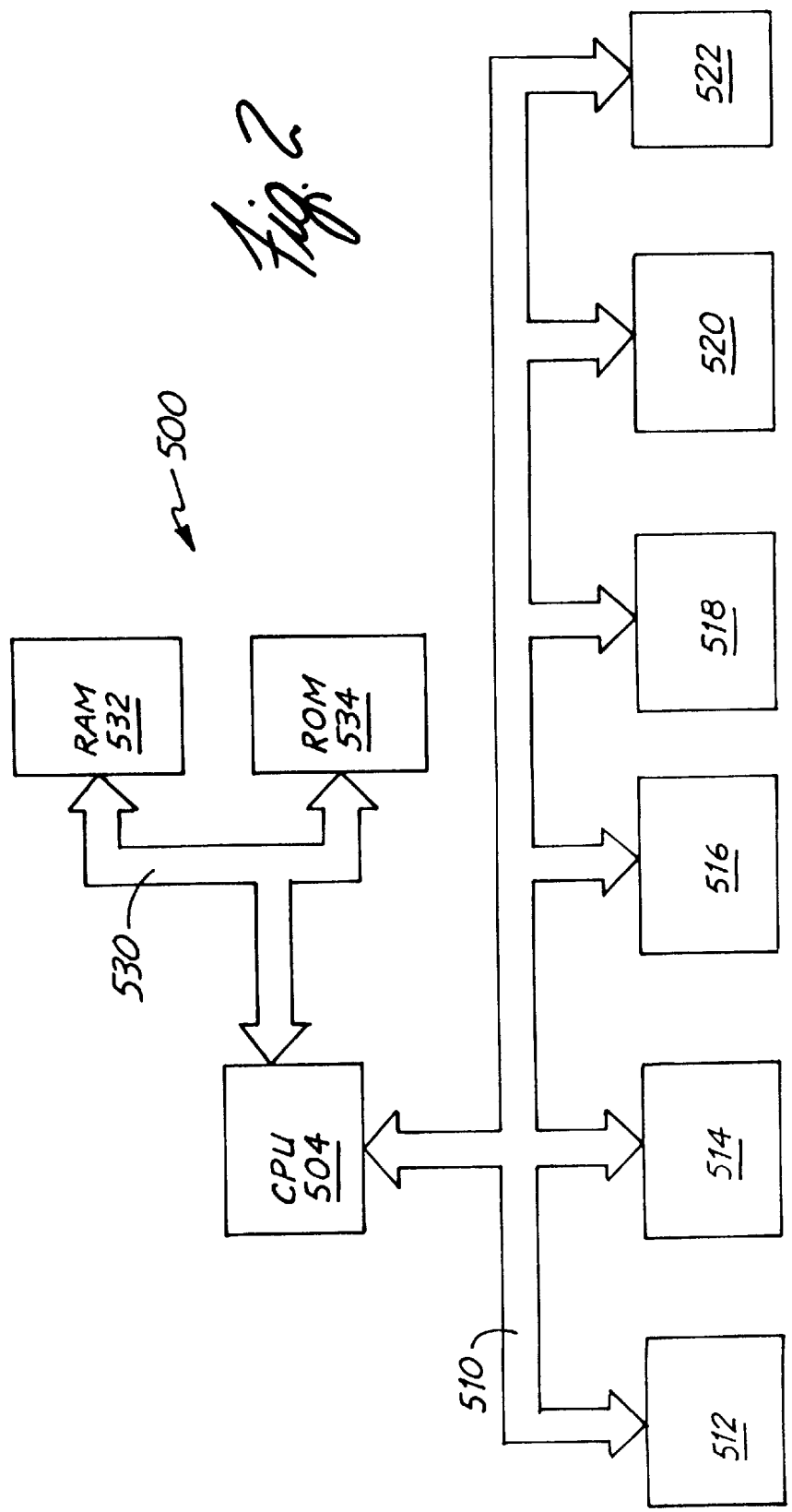

SELECTIVELY SIZED SPACERS

FIELD OF THE INVENTION

The present invention relates generally to integrated circuit manufacturing and more particularly to the formation of selectively sized spacers.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Commonly, devices such as microprocessors for personal computers include a plurality of transistors in series. Each of these transistors usually has identical electrical properties as a result of their being formed simultaneously to one another. For example, each of the transistors usually has an identical threshold voltage, defined as the minimum voltage necessary to be applied between the gate and the drain in order to cause current to flow through the transistor, from the source to the drain. Furthermore, it is known in the art that an operating voltage applied to the first transistor in the series will drop by a threshold voltage when it reaches the second transistor, but will not drop further as it reaches successive transistors (e.g., the third transistor, the fourth transistor, etc.).

However, because the transistors in the series are formed simultaneously such that each of the transistors has identical electrical properties, each of the transistors must thus be formed to have electrical properties sufficient to withstand the total operating voltage applied to the first transistor, even though successive transistors will only need to withstand the total operating voltage minus a threshold voltage. In particular, each transistor in the series is required to have a channel length sufficient to withstand the total operating voltage. However, because all the transistors subsequent to the first transistor are driven by a lesser voltage than that which they were optimally formed to withstand, this means that the transistors operate less quickly than they potentially could.

This reduction in performance becomes especially disadvantageous and problematic in applications where speed is of the utmost importance, such as in microprocessors. There is a need, therefore, to form a series of transistors that each operate at its maximum performance potential, where the first transistor is subjected to a greater operating voltage than successive transistors.

SUMMARY OF THE INVENTION

The above-mentioned shortcomings, disadvantages and problems are addressed by the present invention, which will be understood by reading and studying the following specification. The invention relates to the formation of selectively sized spacers. In one embodiment, a method includes four steps. In the first step, at least one spacer for each of a plurality of gates is formed on a substrate. The plurality of gates includes a first gate and at least one remaining gate. Each spacer is adjacent to an edge of its corresponding gate. In the second step, a mask is applied to the first gate, including the spacers for the first gate. In the third step, the spacers for the remaining gates are etched. In the fourth step, the mask applied to the first gate, including the spacers for the first gate, is removed.

By providing for selectively sized spacers, where the spacers for the first gate are greater in size than the spacers for subsequent gates, the invention overcomes disadvantages found in the prior art. The channel length of a gate extends underneath the gate and its spacers. The channel length of the first gate is thus greater than the channel length of successive gates, because the spacers for the successive gates are etched pursuant to one embodiment of the invention, reducing their geometries. This corresponds to the first gate having a greater threshold voltage than successive gates have.

By precise etching of the spacers for the successive gates, maximum performance at each of the first and successive gates can thus be achieved. That is, if the operating voltage at the first gate having Vt1 is Vcc, then the operating voltage at each of the successive gates is Vcc-Vt1. Therefore, the spacers for the successive gates can be precisely etched so that the channel lengths of these gates are optimally designed for an operating voltage of Vcc-Vt1, and not Vcc, for which the channel length of the first gate is optimally designed. This provides for maximum performance of the device in which these gates are present, such as a microprocessor for a personal computer.

The present invention describes methods, devices, and computerized systems of varying scope. In addition to the aspects and advantages of the present invention described here, further aspects and advantages of the invention will become apparent by reference to the drawings and by reading the detailed description that follows.

BRIEF DESCRIPTION OF THE DRAWINGS

FIGS. 1A–1H show cross-sectional views of successive process steps for making a series of IGFETs having selectively sized spacers, in accordance with one embodiment of the invention; and, FIG. 2 is a diagram of a computerized system, in accordance with which the invention may be implemented.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
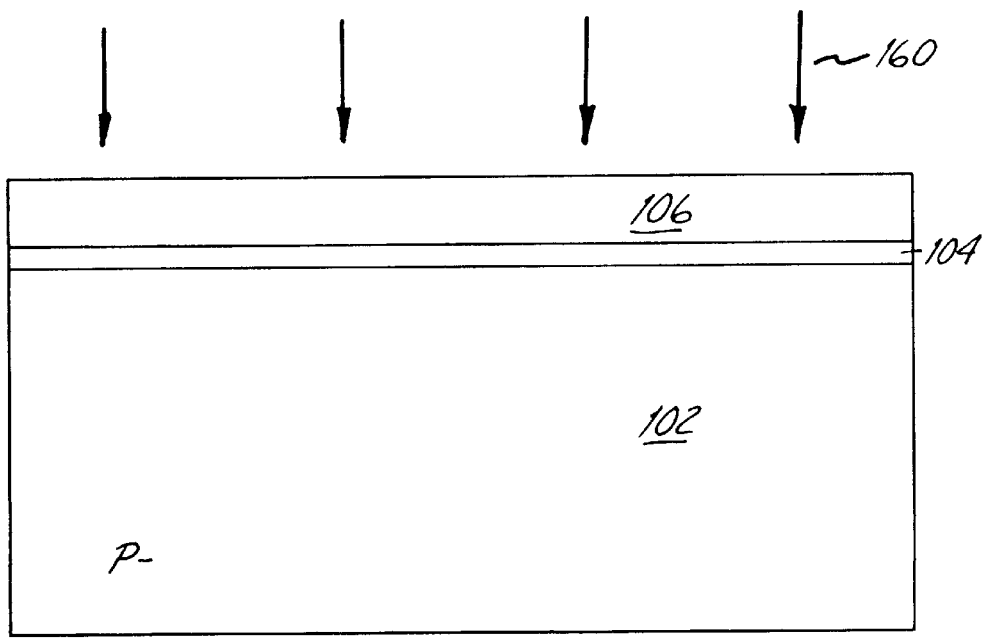

In FIG. 1A, silicon substrate 102 suitable for integrated circuit manufacture includes P-type epitaxial layer with a boron background concentration on the order of $1 \times 10^{16}$ atoms/cm$^2$, a <100> orientation and a resistivity of 12 ohm-cm. Desirably, the epitaxial surface layer is disposed on a P+ base layer, not shown, and includes a planar top surface. Gate oxide 104, comprise of silicon dioxide, is formed on the top surface of substrate 102 using oxide tube growth at a temperature of 700° C. to 1000° C., in an $O_2$ containing ambient. A typical oxidation tube contains several sets of electronically powered heating coils surrounding the tube, which is either quartz, silicon carbide, or silicon, desirably. In $O_2$ gas oxidation, the wafers are placed in the tube in a quartz boat, and the gas flow is directed across the wafer surfaces to the opposite or exhaust end of the tube. Gate oxide 104 has a thickness of 30 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. If also desired, polysilicon 106 can be doped in situ as deposition occurs, or doped before a subsequent etch step by implanting arsenic with a dosage in the range of $5 \times 10^{14}$ to $5 \times 10^{15}$ atoms/cm$^2$, and an energy in the range of 2 to 80 keV. However, it is generally desired that polysilicon 106 be doped during an implantation step following a subsequent etch step.

In FIG. 1A, the polysilicon 106 deposited on the substrate 102 is implanted with arsenic ions and then with nitrogen ions, as depicted by arrows 160. The arsenic ions enhance the rate of silicon dioxide growth in subsequent oxidation processes used to add or grow an additional layer of silicon dioxide. The arsenic ion implant has a dosage in the range of $5 \times 10^{14}$ to $5 \times 10^{15}$ atoms/cm$^2$, and an energy level ranging between about 2 to 80 keV. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5 \times 10^{14}$ to $5 \times 10^{15}$ atoms/cm$^2$, and at an energy level of 20 to 200 keV. Nitrogen ions may be implanted after etching the polysilicon.

Figure 1B:
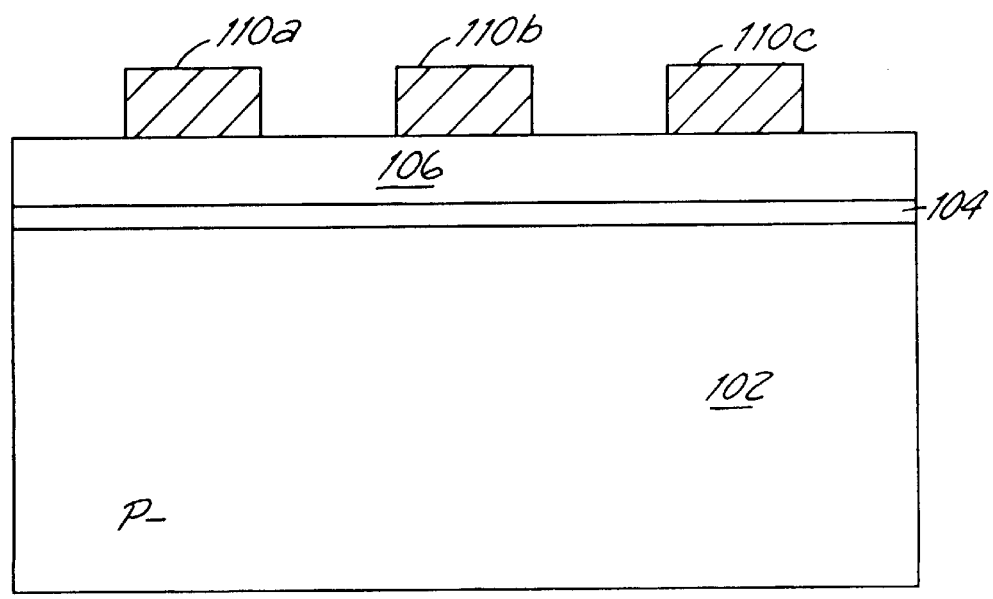

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110; the portions of photoresist remaining are 110a, 110b and 110c. The openings expose portions of polysilicon 106, thereby defining a gate.

Figure 1C:
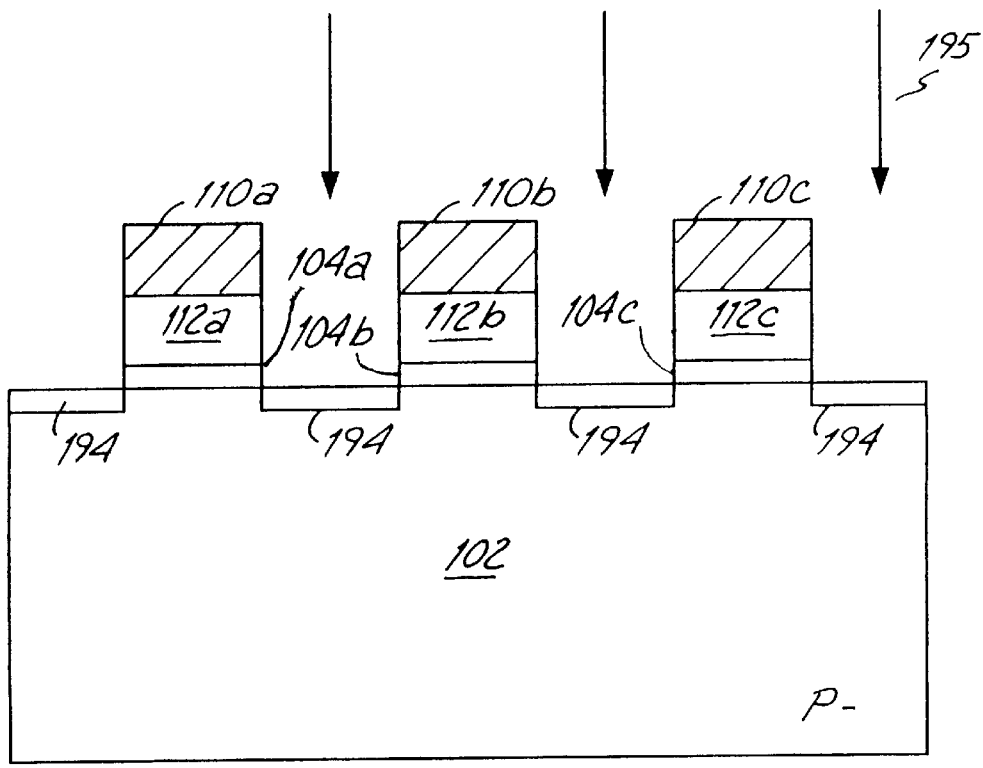

In FIG. 1C, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portions of polysilicon 106 provide polysilicon gates 112a, 112b, and 112c, each with opposing vertical sidewalls (or, edges). Polysilicon gates 112a, 112b and 112c each have a length (between the sidewalls) of 500–2500 angstroms, desirably. Underneath gates 112a, 112b and 112c are the portions of gate oxide remaining, 104a, 104b and 104c.

Furthermore in FIG. 1C, lightly doped regions 194 (any of which may constitute a lightly doped drain (LDD) region) are formed by subjecting the exposed substrate 102 to an ion implantation with a dopant, as represented by arrows 195. Polysilicon gates 112a, 112b, and 112c provide an implant mask for the underlying portion of substrate 102. Desirably, the implant has a dosage in the range of $5 \times 10^{14}$ to $5 \times 10^{15}$ atoms/cm$^2$, and an energy level ranging between about 2 to 80 keV. Suitable dopants include arsenic, arsenic followed by nitrogen, or boron.

Figure 1D:
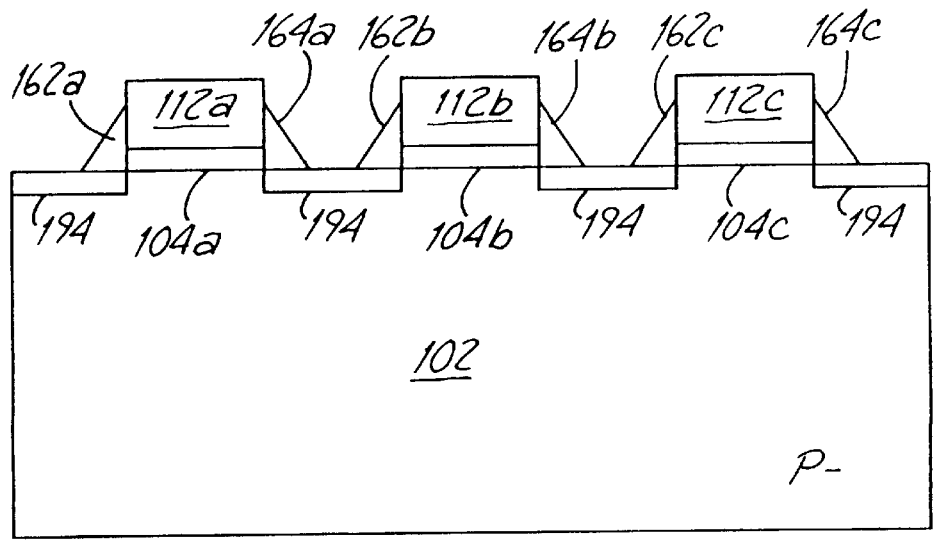

In FIG. 1D, photoresist 110 is stripped, and spacers 162a, 162b, 162c, 164a, 164b, and 164c are formed. The invention is not limited to the manner by which these spacers are formed. In one embodiment, they have a triangular geometry, and are formed by using a high-density plasma (HDP) reactor to simultaneously deposit and etch material to form each spacer. These spacers may then be anistropically etched as necessary to reduce their profiles. The formation of such triangular spacers are more specifically described in the co-assigned patent application entitled "Spacer Formation for Graded Dopant Profile Having Triangular Geometry," filed on Dec. 9, 1997, which is hereby incorporated by reference. The material from which each spacer is formed is desirably oxide, nitride, or oxynitride.

Figure 1E:
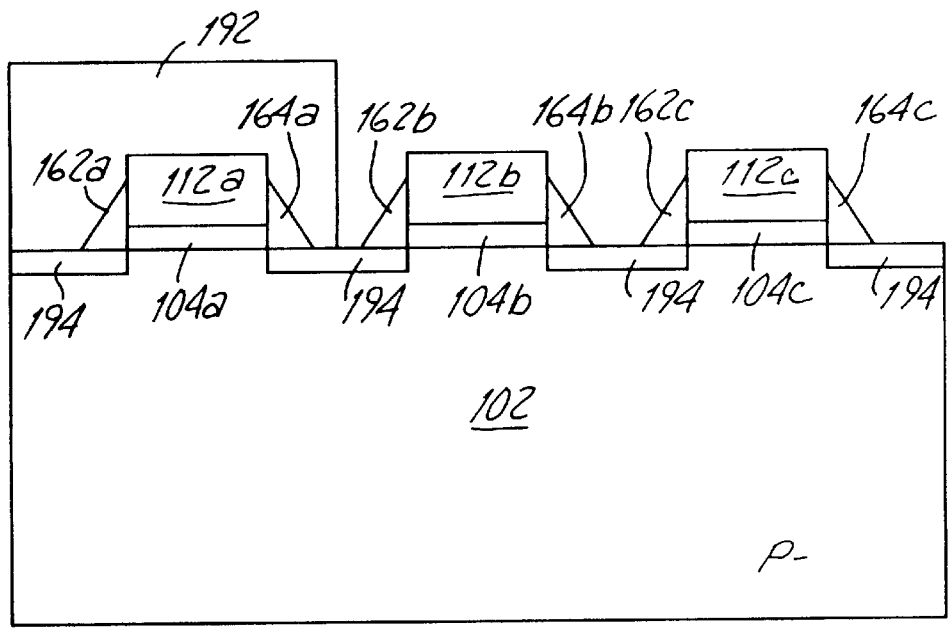

In FIG. 1E, a mask 192 is applied over the entirety of gate 112a, including its associated spacers 162a and 164a. Mask 192 may be photoresist applied over all gates 112a, 112b and 112c, and their associated spacers 162a and 164a, 162b and 164b, and 162c and 164c, respectively, which is then selectively etched from gates 112b and 112c and their associated spacers. However, the invention is not particularly limited to a given manner by which mask 192 is formed.

Figure 1F:
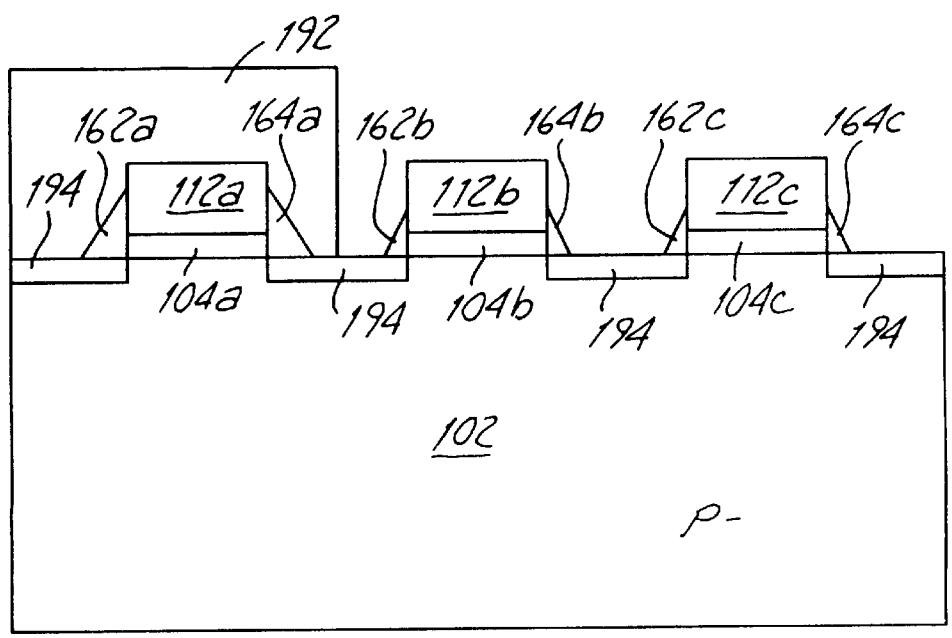

In FIG. 1F, mask 192 is removed (e.g., by etching). Furthermore, spacers 162b and 164b (associated with gate 112b), and spacers 162c and 164c (associated with gate 112c) are anistropically etched to reduce their profiles (i.e., to reduce their length).

In FIG. 1G, highly doped regions 196 are implanted into substrate 102 by subjecting the structure to ion implantation, such as of arsenic or boron, as indicated by arrows 198, at a dose desirably in the range of about $5 \times 10^{13}$ atoms/cm$^2$ to about $2 \times 10^{15}$ atoms/cm$^2$. Polysilicon gates 112a, 112b and 112c provide an implant mask for the underlying portion of substrate 102. For sake of clarity, highly doped regions 196 are shown in FIG. 1F as distinct from lightly doped regions 194 previously formed. However, as those of ordinary skill in the art can appreciate, in reality, regions 194 and 196 are intermingled. After the ion implantation as represented by arrows 198, a rapid thermal anneal (RTA) is applied to cure the ion implantation.

Finally, in FIG. 1H, refractory metal is deposited, as represented by arrows 200. Examples of such refractory metal include titanium and cobalt. Metal silicide layers 202, are formed by reaction with the underlying polysilicon (i.e., regions 194 and gate 112) by an alloying process. The removal of the unreacted refractory metal is then removed from the wafer surface. Not shown in FIG. 1H are the conventional processing steps of placing glass over the surface, and forming a contact opening for subsequently placed connectors. A passivation layer may also then be deposited as a top surface. Additionally, the principal processing steps disclosed herein may be combined with other steps apparent and known to those skilled in the art.

The result of steps FIGS. 1A–1H is a series of IGFETs where the first IGFET has spacers having a greater profile than the spacers of the second and third IGFETs. This results from the etching of the spacers of the second and third IGFETs while the first IGFET is masked. The longer spacers of the first IGFET means that the channel of the first IGFET is longer than the channels of the second and third IGFETs, since the longer spacers of the first IGFET shield more of the lightly doped regions surrounding the gate of the first IGFET from the second ion implantation (to create the heavily doped regions) than the spacers of the second and third IGFETs shield the lightly doped regions surrounding their respective gates from the second ion implantation. Thus, the first IGFET may have a channel length optimal to the operating voltage to which it is subjected, while the successive IGFETs may have a channel length optimal to the operating voltage to which they are subjected (i.e., the operating voltage to which the first IGFET is subjected, minus the threshold voltage of the first IGFET).

Referring next to FIG. 2, advantageously the invention is well-suited for use in a device such as an integrated circuit chip, as well as an electronic system including a central processing unit, a memory and a system bus. The electronic system may be a computerized system 500 as shown in FIG. 2. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals. The graded doping regions having a triangular geometry in the device provides for a fast and reliable channel having a long life. Faster channels are needed as clocking speeds increase, and the channel must also be reliable and long-lived.

The formation of selectively sized spacers has been described. Although specific embodiments have been illustrated and described herein, it will be appreciated by those of ordinary skill in the art that this application is intended to cover adaptations or variations of the present invention. Therefore, it is manifestly intended that this invention be limited only by the following claims and equivalents thereof.

We claim:

1. A method for forming a device comprising:
   forming at least one spacer adjacent to an edge of each of a plurality of gates on a substrate, the plurality of gates including a first gate and at least one remaining gate;
   applying a mask to the first gate, including at least a portion of said at least one spacer for the first gate;
   etching and therein sizing said at least one spacer for each of the at least one remaining gate into a geometry that is smaller than the at least one spacer for the first gate;
   removing the mask from the first gate; and
   applying an ion implantation and forming a highly doped region within the substrate adjacent to the sized at least one spacer.

2. The method of claim 1, wherein applying an ion implantation and forming a highly doped region further includes forming a lightly doped region within the substrate underneath each spacer.

3. The method of claim 2, further comprising applying a rapid thermal anneal (RTA) to cure the ion implantation.

4. The method of claim 3, further comprising forming a metal silicide within the substrate adjacent to each spacer.

5. A method for forming a device comprising:
   forming at least one spacer adjacent to an edge of each of a plurality of gates on a substrate, the plurality of gates including a first gate and at least one remaining gate;
   applying a mask to the first gate, including at least a portion of said at least one spacer for the first gate;
   etching and therein sizing said at least one spacer for each of the at least one remaining gate into a geometry that is smaller than the at least one spacer for the first gate;
   removing the mask from the first gate; and applying an ion implantation and forming a highly doped region within the substrate adjacent to the sized at least one spacer; and
   prior to forming at least one spacer for each of a plurality of gates on a substrate, applying an ion implantation and forming a lightly doped region within the substrate adjacent to each edge of each gate.

6. The method of claim 1, wherein each spacer has a triangular geometry.

7. The method of claim 6, wherein forming at least one spacer comprises using a high-density plasma (HDP) reactor to simultaneously deposit and etch each spacer.

8. The method of claim 6, wherein forming at least one spacer includes anistropically etching each spacer for at least one of the plurality of gates to reduce the triangular geometry of each spacer.

9. A method for forming a device comprising:
   forming at least one spacer adjacent to an edge of each of a plurality of gates on a substrate, the plurality of gates including a first gate and at least one remaining gate;
   applying a mask to the first gate, including at least a portion of said at least one spacer for the first gate;
   etching and therein sizing said at least one spacer for each of the at least one remaining gate into a geometry that is smaller than the at least one spacer for the first gate;
   removing the mask from the first gate; and applying an ion implantation and forming a highly doped region within the substrate adjacent to the sized at least one spacer; and
   forming a third gate on the substrate having a spacer of the smaller geometry.

10. The method of claim 9, wherein the smaller geometry is made by applying a mask to the first gate, including the at least one spacer for the first gate, and etching the at least one second spacer for a second gate.

11. The method of claim 10, wherein forming comprises forming a highly doped region within the substrate adjacent to each first spacer and each second spacer.

12. A method for forming a device comprising:
   forming at least one spacer adjacent to an edge of each of a plurality of gates on a substrate, the plurality of gates including a first gate and at least one remaining gate;
   applying a mask to the first gate, including at least a portion of said at least one spacer for the first gate;
   etching and therein sizing said at least one spacer for each of the at least one remaining gate into a geometry that is smaller than the at least one spacer for the first gate;
   removing the mask from the first gate; and applying an ion implantation and forming a highly doped region within the substrate adjacent to the sized at least one spacer; and
   forming comprises forming a highly doped region within the substrate adjacent to each first spacer and each second spacer.

13. The method of claim 10, wherein forming comprises forming a lightly doped region within the substrate underneath each spacer and each second spacer.

14. A method for forming a device comprising:
   forming at least one spacer adjacent to an edge of each of a plurality of gates on a substrate, the plurality of gates including a first gate and at least one remaining gate;

applying a mask to the first gate, including at least a portion of said at least one spacer for the first gate;

etching and therein sizing said at least one spacer for each of the at least one remaining gate into a geometry that is smaller than the at least one spacer for the first gate;

removing the mask from the first gate; and applying an ion implantation and forming a highly doped region within the substrate adjacent to the sized at least one spacer; and wherein the first gate has a first channel length extending under the first gate and the at least one spacer, and the remaining gate has a second channel length extending under the remaining gate and the at least one spacer of the remaining gate, such that the second channel length is less than the first channel length.

15. The method of claim 10, wherein the first gate has a first channel length extending under the first gate and the at least one spacer, and the remaining gate has a second channel length extending under the remaining gate and the at least one spacer of the remaining gate, such that the second channel length is less than the first channel length.

16. A method for forming a device comprising:

forming at least one spacer adjacent to an edge of each of a plurality of gates on a substrate, the plurality of gates including a first gate and at least one remaining gate;

applying a mask to the first gate, including at least a portion of said at least one spacer for the first gate;

etching and therein sizing said at least one spacer for each of the at least one remaining gate into a geometry that is smaller than the at least one spacer for the first gate;

removing the mask from the first gate; and applying an ion implantation and forming a highly doped region within the substrate adjacent to the sized at least one spacer; and wherein each spacer of the first gate has a first triangular geometry, and each spacer of the remaining gate has a second triangular geometry.

17. The method of claim 14, further including forming each spacer of the first gate and each spacer of the remaining gate, using a high-density plasma (HDP) reactor to simultaneously deposit and etch each first spacer and each second spacer.

18. The method of claim 1, further including forming each spacer of the first gate and each spacer of the remaining gate using a high-density plasma (HDP) reactor to simultaneously deposit and etch each first spacer and each second spacer.

* * * * *

UNITED STATES PATENT AND TRADEMARK OFFICE
CERTIFICATE OF CORRECTION

PATENT NO. : 6,046,089

DATED : April 4, 2000

INVENTOR(S) : GARDNER et al.

It is certified that error appears in the above-identified patent and that said Letters Patent is hereby corrected as shown below:

Col. 3, line 2: "comprise" should read --comprised--.

Signed and Sealed this

Twenty-seventh Day of March, 2001

Attest:

NICHOLAS P. GODICI

Attesting Officer      *Acting Director of the United States Patent and Trademark Office*